United States Patent
Weber

(10) Patent No.: US 7,223,704 B2
(45) Date of Patent: May 29, 2007

(54) REPAIR OF CARBON DEPLETION IN LOW-K DIELECTRIC FILMS

(75) Inventor: Frank Weber, Austin, TX (US)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/927,899

(22) Filed: Aug. 27, 2004

(65) Prior Publication Data
US 2006/0046516 A1 Mar. 2, 2006

(51) Int. Cl.
H01L 21/31 (2006.01)

(52) U.S. Cl. ............... 438/780; 438/778; 430/108.4

(58) Field of Classification Search ........ 438/778–780, 438/788–794; 430/108.4
See application file for complete search history.

(56) References Cited

U.S. PATENT DOCUMENTS

| | | | |
|---|---|---|---|
| 4,828,704 A * | 5/1989 | Yamamoto | 210/635 |
| 5,143,753 A * | 9/1992 | Novotny et al. | 204/601 |
| 6,350,675 B1 | 2/2002 | Chooi et al. | |
| 6,351,039 B1 | 2/2002 | Jin et al. | |
| 6,410,149 B1 | 6/2002 | Hendricks et al. | |
| 6,417,118 B1 * | 7/2002 | Hu et al. | 438/790 |
| 6,521,542 B1 | 2/2003 | Armacost et al. | |
| 6,583,067 B2 | 6/2003 | Chang et al. | |
| 6,605,549 B2 * | 8/2003 | Leu et al. | 438/758 |
| 6,759,325 B2 | 7/2004 | Raaijmakers et al. | |
| 2002/0034647 A1 | 3/2002 | Chen et al. | |
| 2003/0085473 A1 | 5/2003 | Usami | |
| 2003/0198895 A1 | 10/2003 | Toma et al. | |
| 2004/0072436 A1 | 4/2004 | RamachandraRao et al. | |
| 2004/0150012 A1 | 8/2004 | Jin et al. | |
| 2004/0152296 A1 | 8/2004 | Matz et al. | |
| 2005/0233586 A1 * | 10/2005 | Matz et al. | 438/687 |

FOREIGN PATENT DOCUMENTS

WO WO 2004/068555 A2 8/2004

OTHER PUBLICATIONS

Sunseri, J.D., et al., "Reducing Residual Silanol Interactions in Reversed-Phase Liquid Chromotography Thermal Treatment of Silica Before Derivization," Journal of Chromotography A, 1011 (2003) pp. 23-29.

(Continued)

Primary Examiner—Dung A. Le
(74) Attorney, Agent, or Firm—Slater & Matsil, L.L.P.

(57) ABSTRACT

A method of repairing damaged low-k dielectric materials is disclosed. Plasma-based processes, which are commonly used in semiconductor device manufacturing, frequently damage carbon-containing, low-k dielectric materials. Upon exposure to moisture, the damaged dielectric material may form silanol groups. In preferred embodiments, a two-step approach converts the silanol to a suitable organic group. The first step includes using a halogenating reagent to convert the silanol to a silicon halide. The second step includes using a derivatization reagent, preferably an organometallic compound, to replace the halide with the suitable organic group. In a preferred embodiment, the halogenating agent includes thionyl chloride and the organometallic compound includes an alkyllithium, preferably methyllithium. In another preferred embodiment, the organometallic compound comprises a Grignard reagent. Embodiments disclosed herein advantageously enable the manufacturer to engineer the density, polarization, and ionization properties of the low-k dielectric material by selective incorporation of the organic group.

24 Claims, 2 Drawing Sheets

OTHER PUBLICATIONS

Sunseri, J.D., et al., "Complete Methylation of Silica Surfaces: Next Generation of Reversed-Phased Liquid Chromotography Stationary Phases," Langmuir, 19 (2003) pp. 8608-8610.

Satu, E., "Atomic Layer Deposition of a High-Density Aminopropylsiloxane Network on Silica through Sequential Reactions of Gamma-Aminopropyltrialkoxysilanes and Water," Langmuir, vol. 2003, No. 19, American Chemical Society, Nov. 6, 2003, pp. 10601-10609.

* cited by examiner

REPAIR OF CARBON DEPLETION IN LOW-K DIELECTRIC FILMS

TECHNICAL FIELD

This invention relates generally to semiconductor device manufacturing and more particularly to the formation and processing of dielectric films.

BACKGROUND

A goal of semiconductor device manufacturing is to make integrated circuits as small as possible. As devices become smaller, low-k dielectrics are needed to reduce parasitic capacitance and RC switching delay. These materials are particularly useful as intermetal dielectrics, or IMDs, and as interlayer dielectrics, or ILDs.

Low-k dielectric materials refer to those insulating materials that have a dielectric constant lower than that of silicon dioxide, or less than about 4. One example of a low-k material is fluorine-doped silicon dioxide, or fluorosilicate glass (FSG). Another widely used material is a carbon-doped oxide or organosilicate glass (OSG). OSG films typically comprise $Si_wC_xO_yH_z$, wherein the tetravalent silicon may have a variety of organic group substitutions. A commonly used substitution creates methyl silsesquioxane (MSQ), wherein a methyl group creates a $SiCH_3$ bond in place of a SiO bond.

There are several approaches known in the art for reducing the k-value of dielectric films. These include decreasing the film density, reducing the film ionization, and reducing the film polarization. Reduced ionization and reduced polarization are a common feature of carbon-containing, low-k dielectric films. For example, the $Si$—$CH_3$ bond is less polar than the $Si$—$O$ bond. Its tendency to ionize is less as well. Engineering of the organic functionality in low-k films is an important tool for optimizing the properties of these materials.

A major drawback with low-k dielectrics is that they are susceptible to damage from plasma etching and ashing processes used in device fabrication. Such plasma processes include etching, including etching of the low-k film, removing photoresist masking material, and depositing layers in plasma-enhanced chemical vapor deposition (PECVD) processes. In etch and ash processing, low-k materials frequently suffer from carbon depletion at the surface exposed to the plasmas. In certain etch and ash processes, the damage may also extend into the bulk as well. Upon subsequent exposure to air, these damaged surfaces react with moisture to form silanol groups ($\equiv$Si—OH) at free Si sites, if these sites are not already occupied by oxygen during the etch or ash process. The silanol group is known in the art to increase the dielectric constant of the low-k dielectric material. It is also known that the damaged low-k dielectric material is vulnerable to chemical attack during exposure to wet chemical cleanups, which results in significant critical dimension (CD) loss of low-k dielectric film insulating structures. Similar effects are believed to occur in other low-k dielectric materials with silicon-hydrocarbon bonds that are converted to silanol when exposed to oxidizing or reducing plasmas.

Recognizing the need to overcome these drawbacks, semiconductor manufacturers have developed methods to repair damaged low-k dielectric layers. One conventional repair method includes thermal annealing of the low-k dielectric film. However, thermal annealing raises concerns regarding other problems such as thermally induced copper migration. Thermal annealing is also disfavored in that it requires economically unfavorable processing times and equipment costs. Finally, plasma-damaged low-k dielectric films that are annealed according to conventional processes are vulnerable to the re-adsorption of moisture and reformation of silanol.

Another conventional approach includes treating the damaged insulation layer with a silylation agent such as hexamethyldisilazane (HMDS). In this method, a trimethlysilane group replaces the hydrogen of the silanol group.

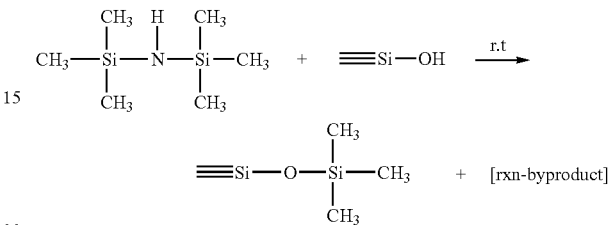

Silylation effectively eliminates the silanol functional group. However, it suffers from the limitation of being able to replace hydrogen with only a silyl group, in this example, a trimethylsilyl group. This shortcoming limits an IC manufacturer's ability to engineer the density, polarization, and ionization properties of the low-k dielectric film.

Semiconductor manufacturers need a method for repairing carbon depletion in low-k dielectrics that is amenable to a wide category of organic compounds.

SUMMARY OF THE INVENTION

These and other problems are generally solved or circumvented, and technical advantages are generally achieved, by preferred embodiments of the present invention that provide a method of repairing low-k dielectric films suffering from carbon depletion.

In preferred embodiments, a two-step approach converts silanol groups to a carbon-containing, organic group. The first step includes using a halogenating reagent, or agent, to convert the silanol group to a silicon halide. The second step includes using a derivatization reagent, also called a derivatizing reagent or derivatizing agent, to replace the halide with a suitable organic group.

In a preferred embodiment, the halogenating agent includes thionyl chloride and the derivatization agent includes an alkyllithium, preferably methyllithium.

In another embodiment, the halogenating agent is selected from the group consisting essentially of $SO_2Cl_2$ (sulfuryl chloride) or $COCl_2$ (carboxydichloride).

In another embodiment, the halogenating agent comprises compounds of bromine or compounds of iodine or compounds of chlorine, or mixtures thereof.

In another embodiment, the organometallic compound comprises a Grignard reagent. In yet another embodiment, the organometallic compound comprises an organic lithium compound, RLi, wherein R is selected from a group consisting essentially of alkyl or aryl compounds. In other embodiment, the organometallic compound is trimethyl aluminum, or more generally $R_AR_BR_CAl$, wherein $R_{A-C}$ may independently include an alkyl or aryl group.

Other embodiments may include non-organometallic derivatizing compounds generally represented by $R_AR_BR_CC(R_DX)$ or $R_AR_BR_CSi(R_DX)$, wherein $R_{A-C}$ may independently include an alkyl group or hydrogen, $R_D$ may independently include an alkyl group, and X includes Br, I, R, O—R (R=alkyl), fluorosulfonate (—O—SO$_2$—F), or triflate (—O—SO$_2$—CF$_3$).

Other embodiments may include non-organometallic derivatizing compounds generally represented by R$_A$R$_B$C=CHR$_C$, wherein R$_{A-C}$ may independently include an alkyl group or hydrogen.

In yet other embodiments, derivatization reactions may fabricate rather than repair low-k, dielectric films. For example, porous silica, not normally considered a low-k dielectric, may be treated with a derivatizing reagent, thereby lowing its k value to a suitable level.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that may be embodied in a wide variety of specific contexts.

The present invention will now be described with respect to preferred embodiments in a specific context, namely specific steps in the manufacture an integrated circuit comprising multiple level copper metallization formed by way of a dual damascene process. Complete details of an exemplary dual damascene manufacturing process are provided in U.S. Pat. No. 6,521,542 to Armacost et al. and are incorporated herein by reference. It is believed that embodiments of this invention are advantageous when used in a damascene metallization process. It is further believed that embodiments described herein will benefit other manufacturing stages involving low-k films not specifically illustrated. Therefore, the specific embodiments discussed are merely illustrative of specific ways to make and use the invention, and do not limit the scope of the invention.

As used herein derivatization refers to a chemical process for replacing one or more select subunits of a chemical compound. Silylation is one example of a derivatization reaction. In silylation, the derivatization reagent HMDS causes a trimethylsilyl group to selectively replace the hydrogen atom of the silanol group. One skilled in the art may refer to HMDS more specifically as a silylation reagent instead of as a derivatization reagent. A derivatization reaction may comprise one or more chemical steps. Other examples of derivatization reactions in detail below.

Figure 1:
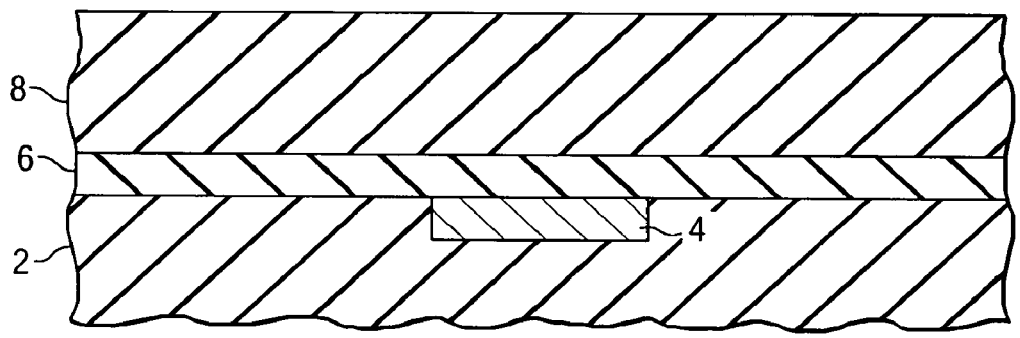
FIGS. 1 through 6 are cross-sectional views illustrating the manufacture of a semiconductor device according to a preferred embodiment of the invention.

Referring to FIG. 1, a conductor 4 is disposed within a trench formed in low-k insulator layer 2 in accordance with a dual damascene process. A silicon nitride (Si$_3$N$_4$) layer 6 is deposited over the insulator 2 and over the conductor 4 to act as an etch stop for subsequent processing and to protect the metal 4 from oxidation according to methods well-known to those skilled in the art. A low-k interlevel dielectric layer 8 is deposited over the nitride layer 6. Dielectric layer 8 overlies a semiconductor substrate (not shown) that may contain, by way of example, resistors or active devices such as transistors and diodes beneath dielectric layer 8. In accordance with preferred embodiments, the low-k interlevel dielectric layer 8 is preferably organosilicate glass (OSG). The OSG 8 is deposited in a conventional manner for such material such as CVD. Depending on the application, this layer 8 may be less than about 1 μm thick.

One skilled in the art recognizes that a cap dielectric layer (not shown) may be disposed upon the low-k insulator layer 8. The cap dielectric layer protects low-k insulator layer 8 from the etches used to form vias and trenches and from CMP after metal deposition. A cap dielectric layer may comprise silicon carbide, or titanium aluminum nitride, titanium nitride, aluminum nitride, tantalum aluminide, tantalum aluminum nitride, and similar materials. Using conventional methods, the cap dielectric layer is generally formed by a plasma-based process, such as plasma enhanced chemical vapor deposition (PECVD).

Because this cap layer deposition involves plasma, the exposed top surface of low-k insulating layer 8 is exposed to the plasma, and the MSQ species at that top surface or, depending upon the process, in the bulk are damaged. This plasma damage is the same as that described above, in that Si—CH$_3$ bonds are broken and silanol (Si—OH) is formed. Plasma damage may also include formation of silicon-hydrogen (Si—H) bonds or silicon dangling bonds. The silicon-hydrogen and silicon dangling bonds are usually converted to silanol upon subsequent exposure to moisture.

Following the plasma PECVD, a carbon depletion repair may be performed. However, according to this embodiment, trenches and vias are also to be etched using plasma into insulator layer 8. Therefore, a carbon depletion repair at this point is optional.

Figure 2:
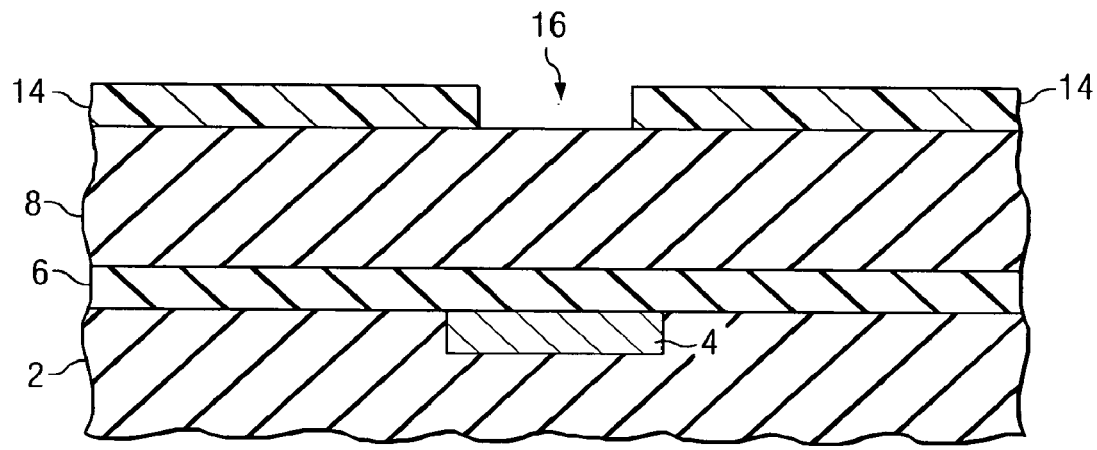

Referring to FIG. 2, the fabrication of the integrated circuit structure continues, with the deposition and application of a photoresist 14. The photoresist layer 14 may be spun on to dielectric layer 8. The photoresist layer 14 is, for example, a standard deep UV resist system, with an ARC such as AR3 (manufactured by Shipley, Marlborough, Mass.), or DUV 30 (manufactured by Brewer Science, Rolla, Mo.) and a photoresist such as JSR resist (manufactured by JSR Microelectronics, Sunnyvale, Calif.). Photoresist 14 is then exposed and developed to define the via locations 16 to be etched through low-k insulator layer 8.

Figure 3:
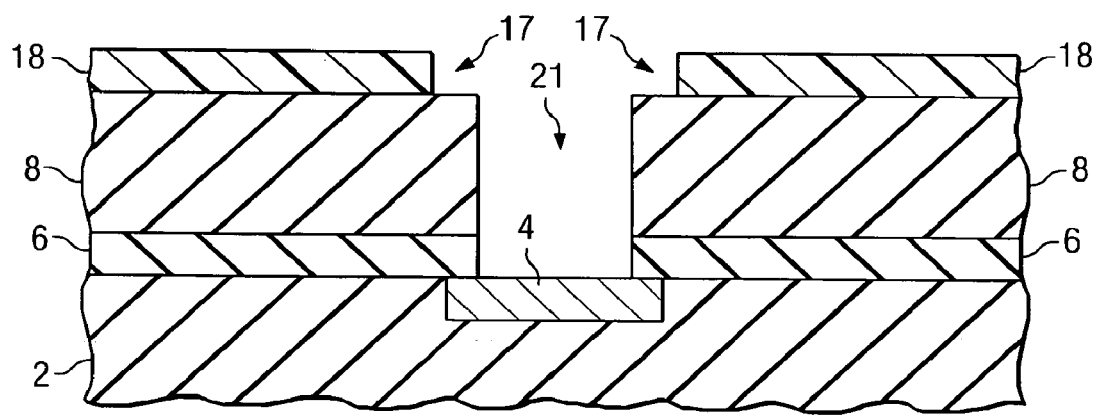

Following the patterning of photoresist 14, the low-k insulator layer 8 is etched to form vias 21 by conventional methods, FIG. 3. As shown in FIG. 3, the photolithographic patterning of trenches to be formed into low-k dielectric layer 8 is performed next. A photoresist layer 18 is dispensed upon the low-k dielectric layer 8. After photolithographic exposure and development, the remaining portions of photoresist layer 18 define the trench locations 17 to be etched into insulating layer 8. As is well known in the dual damascene process, trenches are formed both at via locations, as shown in FIG. 3, and also elsewhere at the surface low-k insulating layer 8 at which copper conductors are to run along the surface of integrated circuit, between or away from via locations.

Figure 4:
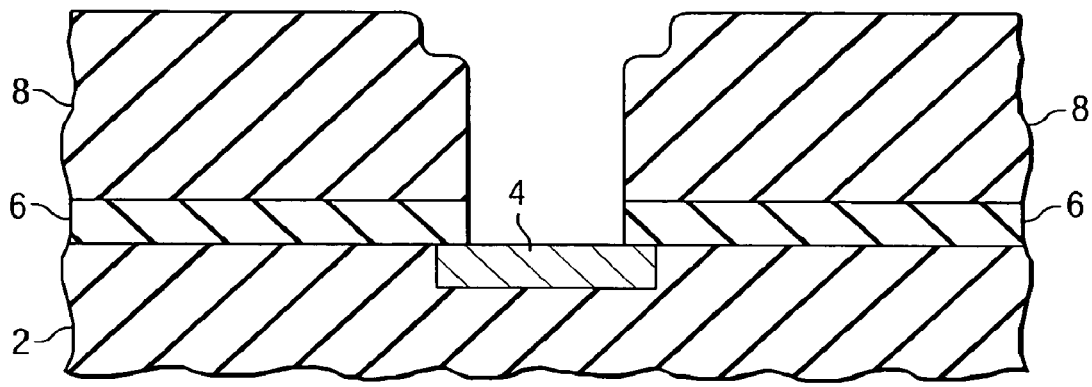

Plasma etch of the low-k insulating layer 8 is then carried out. Because of the dissimilarities in materials between cap dielectric layer (not shown) and insulating layer 8, it is preferred that a two-step etch be performed, with the first etch selectively etching cap dielectric layer. The second etch step, which forms the trenches into insulating layer 8, is preferably a timed plasma etch, to form the wider trenches into insulating layer 8 to a desired trench depth, as shown in FIG. 4.

In alternative embodiments, etching of the cap layer 6 is controlled so that an optional remainder (not shown) is left covering the conductor 4. This remaining cap layer serves to protect the conductor 4 during the subsequent repair steps detailed below.

Photoresist layer 18 may be removed by dry stripping the photoresist in a stripper such as an ASPEN ICP (Inductively Coupled Plasma) or Performance Enhancement Platform (PEP) system (manufactured by Mattson Technology Inc., Fremont, Calif. and Gasonics, San Jose, Calif., respectively).

As previously detailed, plasma manufacturing steps damage the surfaces of insulating layer 8, as well as, in certain circumstances, the bulk. According to this embodiment, carbon depletion repair may be preformed to repair this plasma damage, as shown in FIG. 5.

Figure 5:
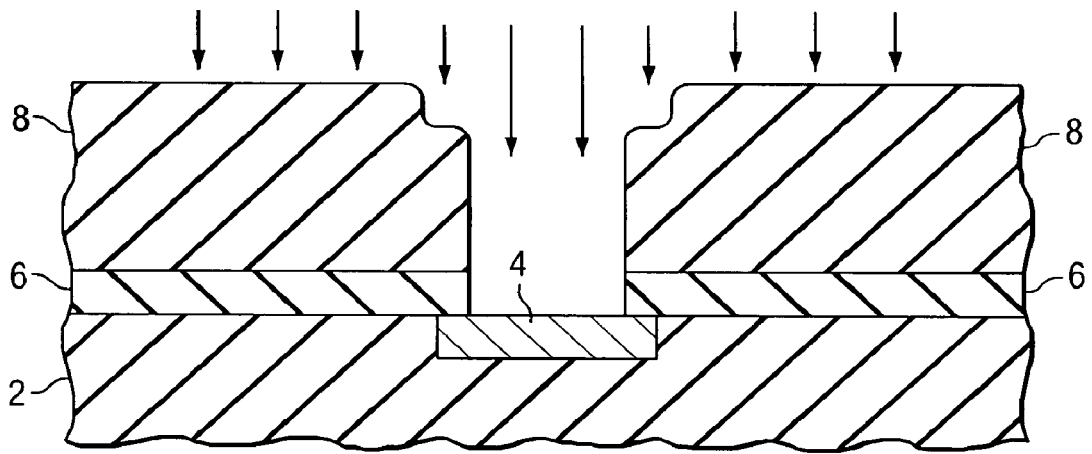

According to this embodiment, a carbon depletion repair, or derivatization reaction, is now carried out, as shown in FIG. 5. In preferred embodiments, the repair process includes a two-step chemical process. Although not illustrated in FIG. 5, repair takes place inside the pores of porous dielectrics in addition to the surface. The first step of the repair process includes converting the silanol group, $\equiv$Si—OH, to a halide with a halogenating agent, preferably thionyl chloride. In this embodiment, the silanol is therefore converted to $\equiv$SiCl.

Instead of thionyl chloride, other chlorinating agents could be used such as sulfuryl chloride, $SO_2Cl_2$, or carboxydichloride, $COCl_2$. Thionyl chloride, however, is particularly preferred since it is easy to purify and it is a liquid at room temperature. Carboxydichloride suffers from the relative disadvantage of being a toxic gas. Instead of using exclusively chloride-based halogenating agents, agents including bromine, iodine, mixed compounds thereof may be used.

The second step of the process illustrated in FIG. 5 comprises replacing the chloride with a suitable organic group, preferably —$CH_3$ whereby the MSQ species are reformed as in the pre-plasma damaged state. The preferred method for replacing the halide comprises coupling of the silicon halide with an organometallic compound, preferably methyl lithium. Because of the water scavenging character of the $\equiv$SiCl bond, the second reaction preferably follows the first with minimal opportunity to contact moisture.

The chemistry of this two-step embodiment is summarized by the following two chemical reactions.

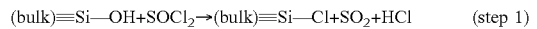
(step 1)

(step 2)

Preferred chemical reaction conditions for steps 1 and 2 are summarized as follows. Prior to step 1, the silanol-containing dielectric is dried at approximately $10^{-3}$ Torr at about 150° C. for about 0.5 to about 12 hours. Distilled and degassed thionyl chloride is reacted with the dielectric while agitating at room temperature. Unreacted thionyl chloride is removed under vacuum, and the substrate is dried under vacuum at room temperature. The reaction chamber is flushed with inert, anhydrous argon. The halogenated dielectric is next reacted, or derivatized, with 1.4 M methyllithium in anhydrous diethyl ether. Anhydrous and anaerobic conditions are particularly advantageous for the organometallic reaction. Both the halogenation and methlyation reactions may proceed for about 0.5 to about 24 hours; however, Applicant believes that about 0.5 hours is preferred. After methylation, the substrate is washed with N,N-dimethylformamide, DMF, and the substrate is dried at 125° C. under vacuum.

In alternative halogenation embodiments, an excess of thionyl chloride may be spun on a wafer at about 40° C. in an anhydrous nitrogen atmosphere. After about 5 minutes, the wafer is cleaned by rinsing with tetrahydrofuran, THF. In still another embodiment, chlorination may comprise treating the dielectric with about 10% thionyl chloride in supercritical $CO_2$ followed by rinsing with liquid $CO_2$.

In alternative methylation embodiments, a 5% solution of methyl lithium in anhydrous diethylether may be spun onto the dielectric in an argon atmosphere. Unreacted methyl lithium may be removed by rinsing with diethylether. The LiCl reaction byproduct is preferably removed by transferring the reaction products to another chamber and then rinsing with a polar, aprotic solvent such as DMF.

For purposes of illustration, chemical reactions are referred to herein as a first step or a second step, or referred to with more specificity such as a halogenation step. One skilled in the art recognizes that such references may actually comprise a plurality of steps or sub-steps. For example, steps or sub-steps may include distillation, extraction, phase separation, purification, temperature changes, or other examples well known in the chemical arts. Furthermore, a step may include using several reaction vessels or containers, mediums, devices, or tools. Such conventional methodologies may be eliminated from the description for purposes of highlighting novel embodiments.

Other embodiments may include lithium organometallics generally represented by RLi, wherein R is an alkyl or aryl compound. Yet another embodiment may include iso-butyl-lithium, $(CH_3)_3CLi$. Also, other embodiments may comprise substituting the lithium organometallic for a corresponding sodium analog. For example, an embodiment may substitute $(CH_3)_3CNa$ for $(CH_3)_3CLi$. Still other embodiments may include aluminum analogs, preferably trimethyl aluminum, $(CH_3)_3Al$.

In preferred embodiments comprising the derivatizing reagent $(CH_3)_3Al$, reaction conditions include treating the dielectric with a vapor containing $(CH_3)_3Al$ for less than about 10 minutes. Following treatment, unreacted reagent and $AlCl_3$ reaction byproduct are removed by evaporation at about 130° C. at a pressure less than about 5 Torr.

In embodiments, the coupling step may comprise a plurality of steps. For example, depending on the organic group, the organometallic lithium compound is first converted to a lithium/copper compound. In the case of alkyl groups, an alkyl halide, RX, is first reacted in an anhydrous solution with elemental lithium to form alkyl lithium. Next, cuprous halide, CuX, is added thereby forming lithium dialkylcopper. The lithium dialkylcopper is reacted with the silicon halide thereby forming ≡SiR.

Choice of the organometallic reagent is important to properly optimize density, polarization, and ionization properties of the low-k dielectric film. For example, it is known in the chemical arts that the coupling of silyl halides and organometallic compounds is highly selective. Therefore, other embodiments may include using a halogenating agent that comprises bromine or iodine knowing that chemical reactivity generally decreases for the larger ions. Also, embodiments can include other classes of organometallic compounds such a Grignard reagents, RMgX, wherein R is preferably alkyl or aryl.

The organometallic derivatization reaction is preferably performed in an anhydrous solvent. The anhydrous solvent may include anhydrous ethyl ether, or a hydrocarbon, or THF. In other embodiments, chemical reactions may occur in solid, liquid, gaseous, or supercritical phases, or combinations thereof. A supercritical phase may include $CO_2$, for example.

Embodiments described herein are particularly suitable for carbon depletion repair wherein silanol OH is replaced by an alkyl group. This is reason is twofold. First, alkyl groups are particularly non-polar and have a low tendency to ionize, thereby increasing their efficacy in forming low-k dielectrics. Secondly, the low chemical reactivity of alkanes makes them particularly preferred for organometallic syntheses. However, other organic groups such as aryl, alkene, ketal, or acetal groups are preferred in other embodiments.

Other derivatizing reagents may include non-organometallic, compounds generally represented by $R_A R_B R_C C(R_D X)$, wherein $R_{A-C}$ may independently include an alkyl group or hydrogen, $R_D$ may independently include an alkyl group, and X includes Br, I, R, O—R (R=alkyl), fluorosulfonate (—O—$SO_2$—F), or triflate (—O—$SO_2$—$CF_3$). Embodiments within this class may also include $H_3C(R_D X)$ as well. One compound of the $R_A R_B R_C C(R_D X)$ class, $(CH_3)_3 CX$, is particularly advantageous. In other embodiments, the group $R_D$ is dropped in favor of a derivatizing reagent generally expressed as $R_A R_B R_C CX$, for example $R_3 CX$ or $H_3 CX$. Reagent $R_A R_B R_C CX$ is particularly advantageous in replacing ≡SiOH with a derivative of the form ≡SiOC.

Proper selection of the derivatizing reagents includes weighing many factors. In preferred embodiments, factors such as steric interactions (also called van der Waals interactions), bond angle strain, and dipole-dipole interactions are weighed in view of the degree of damage of the film as well as its dielectric and chemical properties.

For example, a highly damaged film having many closely-spaced, repair sites preferably includes using a derivatizing reagent such as $R_A R_B R_C C(R_D X)$, wherein $R_{A-D}$ comprise small alkyl groups such as methyl or ethyl along with hydrogen. Such small molecules are not geometrically hindered from reacting at damaged sites. Small molecules also favor access to the interior of damaged pores. On the other hand, for embodiments wherein the damaged sites are widely spaced on the surface and not in pores, bulkier organic groups are preferred. Preferred embodiments may also include using mixtures of derivatizing agents or sequential derivatizing reactions comprising different agents.

In yet other embodiments, derivatizing reagents may include compounds generally represented by $R_A R_B C$=$CHR_C$, wherein $R_{A-C}$ may independently include an alkyl group or hydrogen. Derivatizing agents comprising $R_A R_B CCHR_C$ are particularly advantageous for replacing ≡SiOH with ≡SiOC when the reaction occurs in the presence of a Lewis acid catalyst. Lewis acids include, by way of example, $AlCl_3$, $AlBr_3$, or $BCl_3$. In another embodiment, one member of the $R_A R_B CCHR_C$ class, isobutylene, $(CH_3)_2 C$=$CH_2$, is particularly preferred for preparing a ≡SiOC derivative.

In addition to the derivatization reactions detailed above, other embodiments may include a class of non-organometallic, silylation reagents generally represented by $R_A R_B R_C Si(R_D X)$, wherein $R_{A-D}$ may independently include an alkyl group, and X=Br, I, R, O—R (with R being alkyl), fluorosulfonate, or triflate. Embodiments within this class may also include $H_3 Si(R_D X)$ as well. An embodiment, $R_A R_B R_C SiX$, is particularly preferred for preparing the derivative ≡Si—O—Si≡ from ≡SiOH. One compound of the $R_A R_B R_C SiX$ class, $(CH_3)_3 SiX$, is particularly advantageous.

The non-organometallic derivatizing compounds generally represented by $R_A R_B R_C C(R_D X)$ and $R_A R_B R_C Si(R_D X)$ require no halogenation step since they react directly with silanol. Reaction conditions for these agents are similar to those used with the prior art, low-k, carbon repair agent hexamethyidisilazane (HMDS). For example, reaction conditions for embodiments may include exposing the dielectric to an approximately 5–15% solution of the derivatizing agent dissolved in hexane. Other embodiments may include exposing the dielectric to a vapor containing the derivatizing reagent. After the derivatizing reaction, the unreacted reagent may be removed in a furnace bake out lasting for approximately 30 minutes at approximately 400° C.

Figure 6:
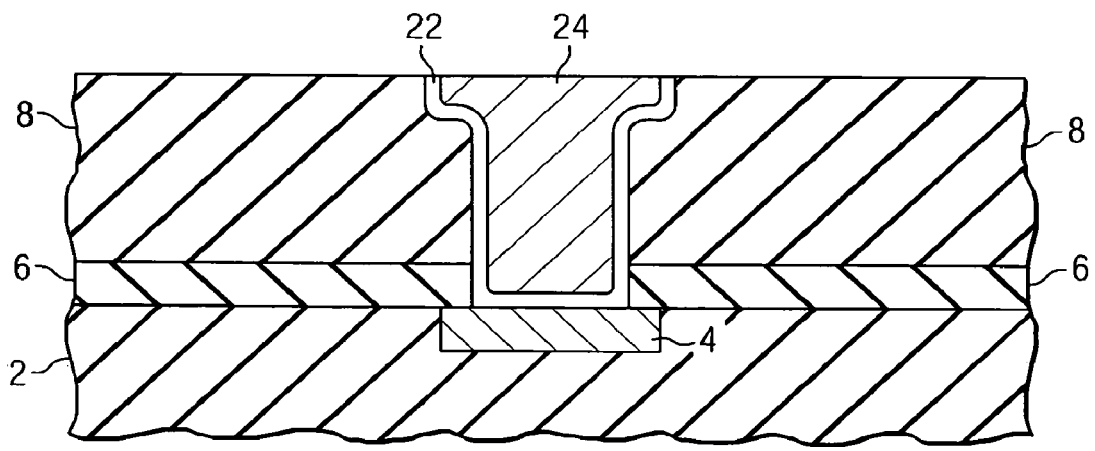

Following the low-k ILD repair, fabrication of the conductor is then carried out, FIG. 6. According to this embodiment of the invention, liner layer 22 is deposited into the vias and trenches. Liner layer 22 typically consists of a refractory metal, refractory metal nitride, or both. Metal 24 is then deposited into the vias and trenches. Preferably, metal 24 is copper, in which case the deposition is carried out by electroplating over a copper seed layer deposited by PVD. CMP then planarizes the structure, rendering metal 24 and liner layer 22 flush with the surface of insulator layer 8. The remainder of the device fabrication, including the repeated forming of low-k insulator layers, via and trench etch, and metal deposition for additional metal levels, may then be carried out.

In another embodiment, the low-k dielectric repair may include correcting non-plasma related damage. For example, pores or other openings in the dielectric film are known to degrade dielectric properties. By way of example, using a derivatizing agent that includes bulky functional groups is an effective means to essentially plug a pore. Bulky functional groups may include, long chain hydrocarbons, multi-ring organics, carbon containing macromolecules, carbon cage molecules such as fullerenes, to name only a few.

Although the present invention and its advantages have been described in detail, it should be understood that various changes, substitutions and alterations may be made herein without departing from the spirit and scope of the invention as defined by the appended claims. For example, it will be readily understood by those skilled in the art that materials and methods may be varied while remaining within the scope of the present invention.

It is also appreciated that the present invention provides many applicable inventive concepts other than the specific contexts used to illustrate preferred embodiments. For example, although the illustrations included repair of a low-k dielectric film, the invention is not limited to only dielectric repair. For example, porous silica is not normally considered to be a low-k dielectric material. However, porous silica may be treated as damaged according to embodiments of this invention. Therefore, embodiments described herein comprise methods suitable for low-k dielectric manufacture, not just repair. A method may comprise depositing a suitable layer or film, preferably porous silica, and then performing a derivatizing reaction using derivatizing reagents described herein.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of fabricating a semiconductor device comprising:
   forming an active device on a substrate;
   depositing a carbon-containing, low-k insulator over the active device;
   exposing the insulator to a plasma;
   forming a silicon halide by reacting a silanol in the insulator with a halogenating agent; and
   performing a derivatizing reaction with the silicon halide.

2. The method of claim 1, wherein the low-k insulator comprises a carbon-doped oxide.

3. The method of claim 1, wherein the low-k insulator comprises porous silica.

4. The method of claim 1, wherein the low-k insulator comprises OSG.

5. The method of claim 1, wherein the halogenating agent is selected from the group consisting essentially of thionyl chloride, sulfuryl chloride and carboxydichloride.

6. The method of claim 1, wherein the halogenating agent is selected from the group consisting essentially of a chloride compound, a bromide compound, and an iodide compound, or a combination thereof.

7. The method of claim 1, wherein the derivatizing reaction includes using an organometallic compound.

8. The method of claim 7, wherein the organometallic compound is a Grignard reagent.

9. The method of claim 7, wherein the organometallic compound is lithium dialkylcopper.

10. The method of claim 7, wherein the organometailic compound is trimethyl aluminum.

11. The method of claim 7, wherein the organometallic compound is methyl lithium.

12. The method of claim 1, wherein the derivatizing reaction includes using a compound corresponding to the general formula $R_A R_B R_C C(R_D X)$:
   wherein $R_A$, $R_B$, $R_C$, and $R_D$ are independently hydrogen or an alkyl group; and
   X is selected from the group consisting of Br, I, O-alkyl, O-fluorosulfonate, and O-triflate.

13. The method of claim 1, wherein the derivatizing reaction includes using a compound corresponding to the general formula $R_A R_B R_C CX$:
   wherein $R_A$, $R_B$, and $R_C$ are independently hydrogen or an alkyl group; and
   X is selected from the group consisting of Br, I, O-alkyl, O-fluorosulfonate, and O-triflate.

14. The method of claim 1, wherein the derivatizing reaction includes using a compound corresponding to the general formula $R_A R_B C = CHR_C$, wherein $R_{A-C}$ are independently hydrogen or an alkyl group.

15. The method of claim 14, wherein the derivatizing reaction further includes using a Lewis acid.

16. The method of claim 1, wherein the derivatizing reaction includes using a silylation agent.

17. The method of claim 16, wherein the silylation agent corresponds to the general formula $R_A R_B R_C Si(R_D X)$:
   wherein $R_A$, $R_B$, $R_C$, and $R_D$ are independently hydrogen or an alkyl group; and
   X is selected from the group consisting of Br, I, O-alkyl, O-fluorosulfonate, and O-triflate.

18. The method of claim 16, wherein the silylation agent corresponds to the general formula $R_A R_B R_C SiX$:
   wherein $R_A$, $R_B$, and $R_C$, are independently alkyl, aryl, or hydrogen; and
   X is selected from the group consisting of Br, I, O-alkyl, O-fluorosulfonate, and O-triflate.

19. A method of fabricating a semiconductor device comprising:
   depositing a carbon-containing dielectric on an active device;
   halogenating the carbon-containing dielectric; and
   derivatizing the carbon-containing dielectric after halogenating.

20. The method of claim 19, further comprising exposing the carbon-containing dielectric to a plasma.

21. The method of claim 20, wherein the carbon-containing dielectric further comprises an organosilicate glass.

22. The method of claim 19, wherein halogenating the carbon-containing dielectric further comprises using thionyl chloride, sulfuryl chloride, or carboxydichloride.

23. The method of claim 19, wherein derivatizing the carbon-containing dielectric after halogenating further comprises using an alkyl lithium compound or a Grignard reagent.

24. The method of claim 19, wherein derivatizing the carbon-containing dielectric after halogenating further comprises using a compound corresponding to the general formula $R_A R_B R_C Si(R_D X)$ or $R_A R_B R_C C(R_D X)$:
   wherein $R_A$, $R_B$, $R_C$, and $R_D$ are independently hydrogen or an alkyl group; and
   X is selected from the group consisting of Br, I, O-alkyl, O-fluorosulfonate, and O-triflate.

* * * * *